United States Patent
Shao

(10) Patent No.: US 9,219,409 B2
(45) Date of Patent: Dec. 22, 2015

(54) CHARGE PUMP REGULATOR WITH SMALL RIPPLE OUTPUT SIGNAL AND ASSOCIATED CONTROL METHOD

(71) Applicant: eMemory Technology Inc., Hsin-Chu (TW)

(72) Inventor: Chi-Yi Shao, Taichung (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/509,627

(22) Filed: Oct. 8, 2014

(65) Prior Publication Data

US 2015/0288278 A1 Oct. 8, 2015

Related U.S. Application Data

(60) Provisional application No. 61/973,852, filed on Apr. 2, 2014.

(51) Int. Cl.
*G05F 1/10* (2006.01)
*H02M 3/07* (2006.01)
*H02M 1/14* (2006.01)

(52) U.S. Cl.
CPC . *H02M 3/07* (2013.01); *H02M 1/14* (2013.01)

(58) Field of Classification Search
CPC ......... H02M 3/07; H02M 3/073; H02M 1/14; G05F 1/62
See application file for complete search history.

(56) References Cited

U.S. PATENT DOCUMENTS

| | | | |
|---|---|---|---|
| 6,278,317 B1 * | 8/2001 | Hsu | H02M 3/073 327/536 |
| 7,215,181 B2 | 5/2007 | Hahn et al. | |
| 7,253,676 B2 * | 8/2007 | Fukuda | H02M 3/073 327/536 |
| 7,928,796 B2 * | 4/2011 | Namekawa | H02M 3/073 327/114 |

* cited by examiner

*Primary Examiner* — Jeffrey Zweizig
(74) *Attorney, Agent, or Firm* — WPAT, PC; Justin King

(57) ABSTRACT

A charge pump regulator includes a charge pump circuit, a voltage divider, a mode determining circuit, a frequency divider, and a selecting circuit. The charge pump circuit receives an oscillation signal and generates an output signal. The voltage divider receives the output signal and generates a first and a second divided voltages. The mode determining circuit determines whether the charge pump regulator is in a pumping mode or a detecting mode, and issues a first control signal. When the mode determining circuit is in the pumping mode, a pumping enable signal is activated and the clock signal is converted into the oscillation signal by the selecting circuit. When the mode determining circuit is in the detecting mode, a detecting enable signal is activated and the frequency divider generates a detecting signal according to the first control signal.

21 Claims, 8 Drawing Sheets

US 9,219,409 B2

CHARGE PUMP REGULATOR WITH SMALL RIPPLE OUTPUT SIGNAL AND ASSOCIATED CONTROL METHOD

This application claims the benefit of U.S. provisional patent application No. 61/973,852, filed Apr. 2, 2014, the subject matter of which is incorporated herein by reference.

FIELD OF THE INVENTION

The present invention relates to a charge pump regulator, and more particularly to a charge pump regulator with a small ripple output signal and an associated control method.

BACKGROUND OF THE INVENTION

FIG. 1A is a schematic circuit diagram illustrating a conventional charge pump regulator. FIG. 1B is a schematic timing waveform diagram illustrating associated signal processed by the conventional charge pump regulator of FIG. 1A. The charge pump regulator 100 comprises a charge pump circuit 110 and a feedback detector 120. An output signal Vout is generated by the charge pump regulator 100 and transmitted to a bulk capacitor C and a load 150.

A clock input terminal CK of the charge pump circuit 110 receives an oscillation signal Osc. An output terminal of the charge pump circuit 110 issues the output signal Vout. When the oscillation signal Osc is maintained at a fixed voltage level, the magnitude of the output signal Vout gradually decreases. Whereas, when the oscillation signal Osc is switched between a high level state and a low level state, the magnitude of the output signal Vout gradually increases according to a signal edge (e.g. a rising edge or a falling edge) of the oscillation signal Osc.

Moreover, the feedback detector 120 comprises a voltage divider consisting of two resistors R1 and R2, a comparator 122 and a NAND gate 124. The voltage divider receives the output signal Vout and generates a feedback signal Vfb. A negative input terminal of the comparator 122 receives the feedback signal Vfb. A positive input terminal of the comparator 122 receives a reference voltage Vref. An output terminal of the comparator 122 generates a control signal Vco1. A first input terminal of the NAND gate 124 receives a clock signal CLK. A second input terminal of the NAND gate 124 receives the control signal Vco1. An output terminal of the NAND gate 124 generates the oscillation signal Osc.

In the voltage divider, the relationship between the output signal Vout and the feedback signal Vfb is expressed as: Vfb=(R2×Vout)/(R1+R2). As the magnitude of the output signal Vout increases, the magnitude of the feedback signal Vfb increases. On the other hand, as the magnitude of the output signal Vout decreases, the magnitude of the feedback signal Vfb decreases.

Moreover, if the magnitude of the feedback signal Vfb is higher than the magnitude of the reference voltage Vref, the control signal Vco1 is in the low level state and the oscillation signal Osc is maintained in the high level state. Consequently, the magnitude of the output signal Vout gradually decreases. Whereas, if the magnitude of the feedback signal Vfb is lower than the magnitude of the reference voltage Vref, the control signal Vco1 is in the high level state and the oscillation signal Osc is equal to an inverted clock signal $\overline{CLK}$ (i.e. Osc=$\overline{CLK}$). Consequently, the magnitude of the output signal Vout gradually increases according to the signal edge of the oscillation signal Osc.

When the charge pump regulator 100 reaches the steady state, the output signal Vout is maintained at a level near a target voltage. The target voltage is equal to Vref×(1+R1/R2).

Please refer to FIG. 1B. Before the time point t1, the magnitude of the feedback signal Vfb is lower than the magnitude of the reference voltage Vref. Consequently, the output signal Vout gradually increases. After the time point t1, the feedback signal Vfb reaches a level near the reference voltage Vref. Consequently, the output signal Vout is maintained at a level near the target voltage. The target voltage is equal to Vref×(1+R1/R2).

Since the magnitude of the feedback signal Vfb is sometimes higher than the reference voltage Vref and the magnitude of the feedback signal Vfb is sometimes lower than the reference voltage Vref, the output signal Vout contains ripple. For example, if R1/R2 is equal to 4, the reference voltage Vref is 1.2V and the magnitude of the output signal Vout is 6V, the peak-to-peak ripple voltage of the output signal Vout is about 563 mV.

Please refer to an enlarged fragmentary portion A of FIG. 1B. Theoretically, when the magnitude of the feedback signal Vfb is lower than the reference voltage Vref (at the time point ta), the control signal Vco1 from the comparator 122 should be switched to the high level state. Consequently, the oscillation signal Osc is switched between the high level state and the low level state, and the output signal Vout gradually increases.

However, due to the output delay of the comparator 122, the control signal Vco1 from the comparator 122 is switched to the high level state until the time point tb. That is, during the time period between the time point ta and the time point tb, the oscillation signal Osc is still maintained at the high level state and the magnitude of the output signal Vout continuously decreases by ΔVi. The time period I between the time point ta and the time point tb is referred as a comparator delay period.

At the time point tb, the control signal Vco1 from the comparator 122 is switched to the high level state. However, since the clock signal CLK is still in the low level state, the oscillation signal Osc is still maintained at the high level state and the magnitude of the output signal Vout continuously decreases by ΔVii. Until the time point tc, the clock signal CLK is switched to the high level state. Consequently, the level state of the oscillation signal Osc is switched, and the magnitude of the output signal Vout starts to increase. The time period II between the time point tb and the time point tc is referred as an enable pump delay period.

At the time point td, the control signal Vco1 from the comparator 122 is switched to the low level state. It means that it is not necessary to increase the magnitude of the output signal Vout. Since the clock signal CLK is still in the high level state, the oscillation signal Osc results in a rising edge. Consequently, during the time period between the time point td and the time point te, the magnitude of the output signal Vout continuously increases by ΔViii. The time period III between the time point td and the time point te is referred as a disable pump delay period.

From the above discussions, the comparator delay period I and the enable pump delay period II may result in excess decrease of the output signal Vout, and the disable pump delay period III may result in excess increase of the output signal Vout. That is, due to the excess increase and the excess decrease of the output signal Vout, the peak-to-peak ripple voltage of the output signal Vout is too large.

SUMMARY OF THE INVENTION

The present invention provides a charge pump regulator with a small ripple output signal for avoiding the excess increase and the excess decrease of the output signal in the enable pump delay period and the disable pump delay period, thereby effectively reducing the peak-to-peak ripple voltage of the output signal.

An embodiment of the present invention provides a charge pump regulator. The charge pump regulator includes a charge pump circuit, a voltage divider, a mode determining circuit, a frequency divider, and a selecting circuit. The charge pump circuit has a clock input terminal receiving an oscillation signal and an output terminal generating an output signal. The voltage divider receives the output signal and generates a first divided voltage and a second divided voltage. The mode determining circuit receives the first divided voltage and the second divided voltage, and determines whether the charge pump regulator is in a pumping mode or a detecting mode according to the first divided voltage and the second divided voltage. The mode determining circuit issues a first control signal. When the mode determining circuit is in the pumping mode, a pumping enable signal is activated. When the mode determining circuit is in the detecting mode, a detecting enable signal is activated. The frequency divider receives the detecting enable signal and the first control signal. When the detecting enable signal is activated, the frequency divider generates a detecting signal according to the first control signal, wherein a frequency of the first control signal is a multiple of a frequency of the detecting signal. The selecting circuit receives the detecting signal, a clock signal and the pumping enable signal. When the pumping enable signal is activated, the clock signal is converted into the oscillation signal by the selecting circuit. When the pumping enable signal is inactivated, the detecting signal is converted into the oscillation signal by the selecting circuit.

Another embodiment of the present invention provides a charge pump regulator. The charge pump regulator includes a charge pump circuit, a voltage divider, a mode determining circuit, a frequency divider, and a selecting circuit. The charge pump circuit has a clock input terminal receiving an oscillation signal and an output terminal generating an output signal. The voltage divider receives the output signal and generates a first divided voltage. The mode determining circuit receives the first divided voltage, and determines whether the charge pump regulator is in a pumping mode or a detecting mode according to the first divided voltage. The mode determining circuit issues a first control signal. When the mode determining circuit is in the pumping mode, a pumping enable signal is activated. When the mode determining circuit is in the detecting mode, a detecting enable signal is activated. The frequency divider receives the detecting enable signal and the first control signal. When the detecting enable signal is activated, the frequency divider generates a detecting signal according to the first control signal. A frequency of the first control signal is a multiple of a frequency of the detecting signal. The selecting circuit receives the detecting signal, a clock signal and the pumping enable signal. When the pumping enable signal is activated, the clock signal is converted into the oscillation signal by the selecting circuit. When the pumping enable signal is inactivated, the detecting signal is converted into the oscillation signal by the selecting circuit.

Another embodiment of the present invention provides a method for controlling a charge pump regulator in a pumping mode or in a detecting mode in response to a comparison among an output voltage of the charge pump regulator, a first threshold voltage and a second threshold voltage. The method comprises steps of: operating the charge pump regulator in the pumping mode when a magnitude of an output voltage of the charge pump regulator increases and the magnitude of the output voltage of the charge pump regulator is lower than the second threshold voltage, wherein a charge pump circuit of the charge pump regulator is activated to increase the magnitude of the output voltage of the charge pump regulator in the pumping mode; operating the charge pump regulator in the detecting mode when the magnitude of an output voltage of the charge pump regulator increases and the magnitude of the output voltage of the charge pump regulator is higher than the second threshold voltage, wherein a charge pump circuit of the charge pump regulator is activated to maintain the magnitude of the output voltage of the charge pump regulator near a target voltage in the detecting mode; operating the charge pump regulator in the detecting mode when the magnitude of an output voltage of the charge pump regulator decreases and the magnitude of the output voltage of the charge pump regulator is higher than the first threshold voltage; and operating the charge pump regulator in the pumping mode when the magnitude of an output voltage of the charge pump regulator decreases and the magnitude of the output voltage of the charge pump regulator is lower than the first threshold voltage; wherein the second threshold voltage is higher than the first threshold voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
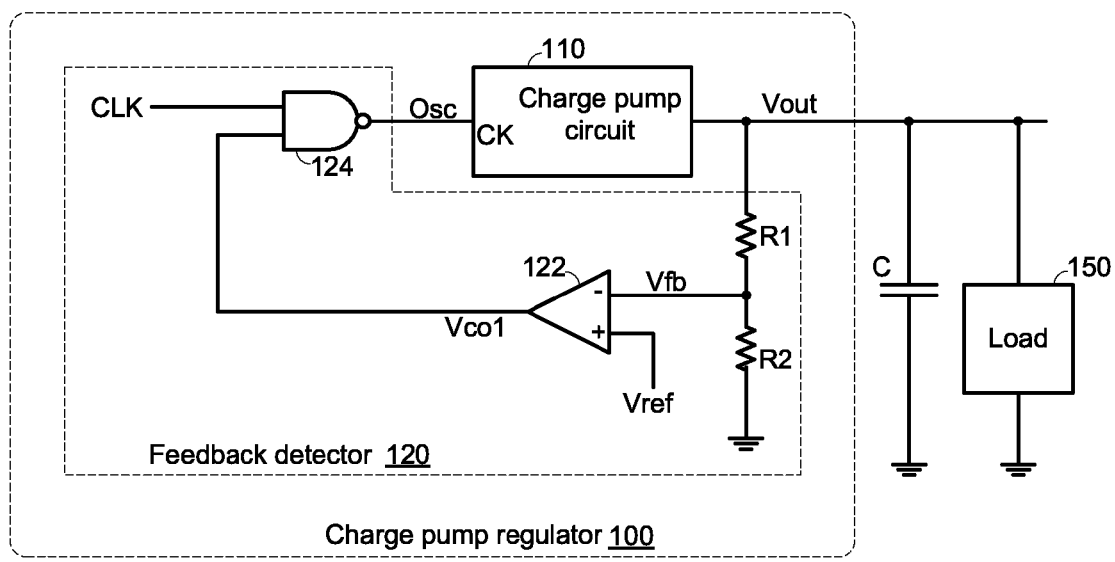
FIG. 1A (prior art) is a schematic circuit diagram illustrating a conventional charge pump regulator.
Figure 1B:
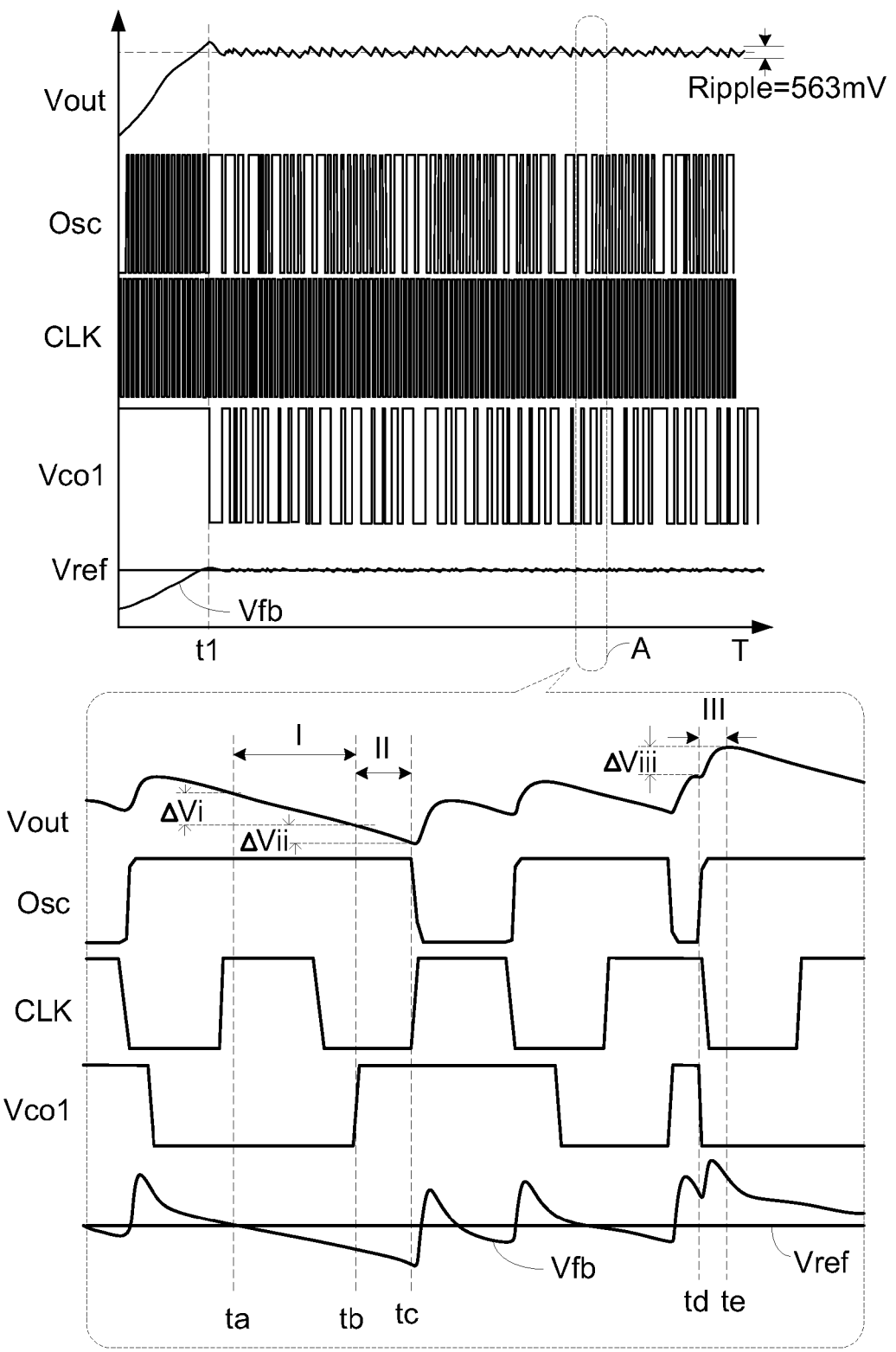
FIG. 1B (prior art) is a schematic timing waveform diagram illustrating associated signal processed by the conventional charge pump regulator of FIG. 1A.
Figure 2:
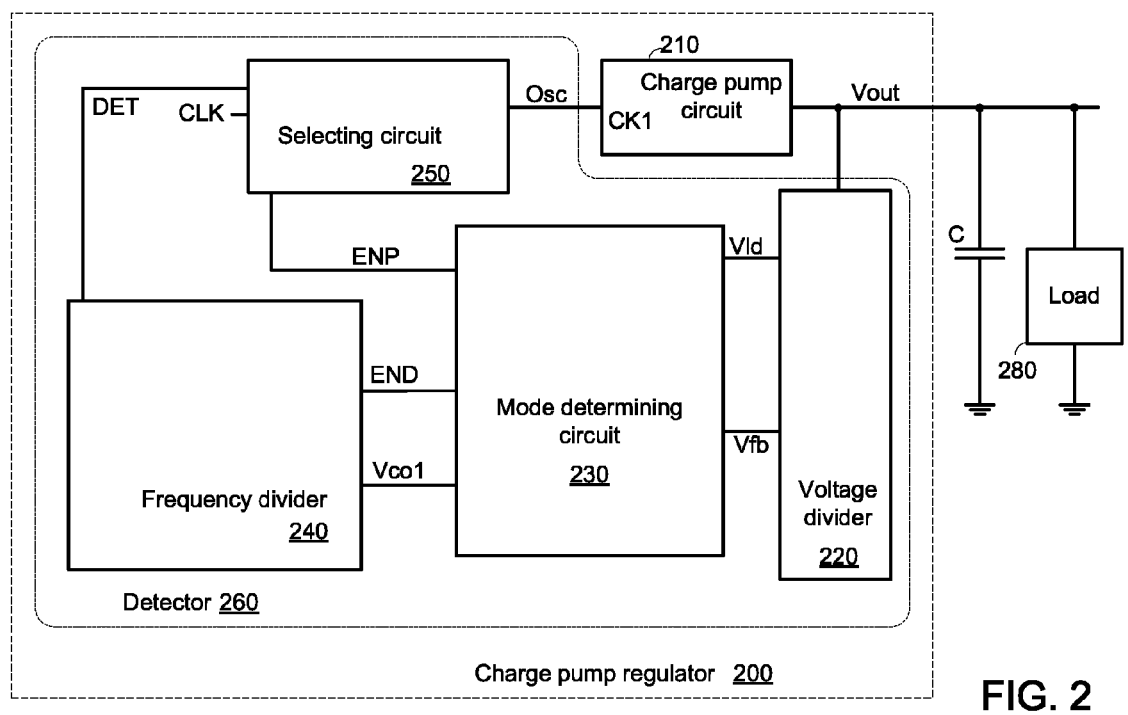
FIG. 2 is a schematic circuit block diagram illustrating a charge pump regulator according to an embodiment of the present invention.

FIG. 2 is a schematic circuit block diagram illustrating a charge pump regulator according to an embodiment of the present invention. As shown in FIG. 2, the charge pump regulator 200 comprises a charge pump circuit 210 and a detector 260. An output signal Vout is generated by the charge pump regulator 200 and transmitted to a bulk capacitor C and a load 280.

A clock input terminal CK1 of the charge pump regulator 210 receives an oscillation signal Osc. An output terminal of the charge pump regulator 210 issues an output signal Vout. When the oscillation signal Osc is maintained at a fixed voltage level, the magnitude of the output signal Vout gradually decreases. Whereas, when the oscillation signal Osc is switched between a high level state and a low level state, the magnitude of the output signal Vout gradually increases according to a signal edge (e.g. a rising edge or a falling edge) of the oscillation signal Osc.

The detector 260 comprises a voltage divider 220, a mode determining circuit 230, a frequency divider 240, and a selecting circuit 250. The voltage divider 220 consists of plural resistors. According to the output signal Vout, the voltage divider 220 generates a first divided voltage Vfb and a second divided voltage Vld. There are fixed ratios between the output signal Vout, the first divided voltage Vfb and the second divided voltage Vld. Moreover, the magnitude of the output signal Vout is higher than the magnitude of the second divided voltage Vld, and the magnitude of the second divided voltage Vld is higher than the magnitude of the first divided voltage Vfb.

The mode determining circuit 230 receives the first divided voltage Vfb and the second divided voltage Vld. According to the first divided voltage Vfb and the second divided voltage Vld, the charge pump regulator 200 is selectively operated in a pumping mode or a detecting mode. The mode determining circuit 230 issues a first control signal Vco1. Moreover, a pumping enable signal ENP is activated when the mode determining circuit 230 is in the pumping mode, and a detecting enable signal END is activated when the mode determining circuit 230 is in the detecting mode.

The frequency divider 240 receives the detecting enable signal END and the first control signal Vco1. When the detecting enable signal END is activated, the frequency divider 240 generates a detecting signal DET according to the first control signal Vco1. The frequency of the first control signal Vco1 is a multiple of the frequency of the detecting signal DET.

The selecting circuit 250 receives the detecting signal DET, the clock signal CLK and the pumping enable signal ENP. When the pumping enable signal ENP is activated, the clock signal CLK is converted into the oscillation signal Osc by the selecting circuit 250. On the other hand, when the pumping enable signal ENP is inactivated, the detecting signal DET is converted into the oscillation signal Osc by the selecting circuit 250.

Figure 3:
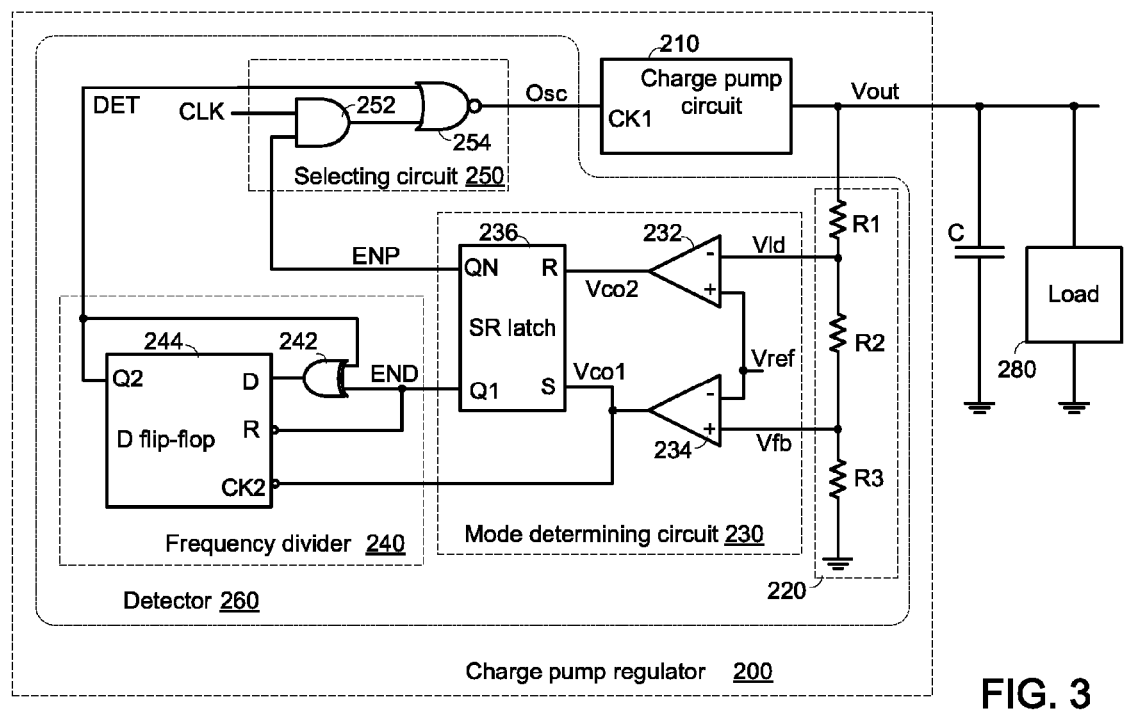
FIG. 3 is a schematic circuit diagram illustrating the detailed circuitry of the charge pump regulator according to the embodiment of the present invention.

FIG. 3 is a schematic circuit diagram illustrating the detailed circuitry of the charge pump regulator according to the embodiment of the present invention. The voltage divider 220 consists of plural resistors R1, R2 and R3, which are arranged between the output terminal of the charge pump circuit 210 and a ground terminal in series. The node voltage at the node between the first resistor R1 and the second resistor R2 is equal to the second divided voltage Vld. The node voltage at the node between the second resistor R2 and the third resistor R3 is equal to the first divided voltage Vfb. The first divided voltage Vfb may be expressed as $Vfb=Vref\times(R3)/(R1+R2+R3)$, and the second divided voltage Vld may be expressed as $Vld=Vref\times(R2+R3)/(R1+R2+R3)$. Moreover, when the charge pump regulator 200 reaches the steady state, the output signal Vout is maintained at a level near a target voltage. The target voltage is equal to $Vref\times[1+(R1+R2)/R3]$.

The mode determining circuit 230 comprises a comparator 232, a comparator 234 and a SR latch 236. The positive input terminal of the comparator 234 receives the first divided voltage Vfb. The negative input terminal of the comparator 234 receives a reference voltage Vref. The output terminal of the comparator 234 issues the first control signal Vco1. The positive input terminal of the comparator 232 receives the reference voltage Vref. The negative input terminal of the comparator 232 receives the second divided voltage Vld. The output terminal of the comparator 232 issues a second control signal Vco2. A set terminal S of the SR latch 236 receives the first control signal Vco1. A reset terminal R of the SR latch 236 receives a second control signal Vco2. An output terminal Q1 of the SR latch 236 generates the detecting enable signal END. An inverted output terminal QN of the SR latch 236 generates the pumping enable signal ENP.

Moreover, a truth table of the SR latch 236 is listed as follows.

| S | R | Q | QN |
|---|---|---|---|
| 0 | 0 | Previous state | Previous state |
| 0 | 1 | 0 | 1 |
| 1 | 0 | 1 | 0 |
| 1 | 1 | 0 | 0 |

The frequency divider 240 comprises an XOR gate 242 and a D flip-flop 244. The two input terminals of the XOR gate 242 receive the detecting enable signal END and the detecting signal DET, respectively. The input terminal of the D flip-flop 244 is connected to the output terminal of the XOR gate 242. The rest terminal of the D flip-flop 244 receives the detecting enable signal END. The clock input terminal CK2 of the D flip-flop 244 receives the first control signal Vco1. The output terminal Q2 of the D flip-flop 244 generates the detecting signal DET. In an embodiment, the D flip-flop 244 is a negative edge triggered D flip-flop. Moreover, when the detecting enable signal END is inactivated, the D flip-flop 244 is reset. Consequently, the output terminal Q2 of the D flip-flop 244 is in a low level state.

In this embodiment, the D flip-flop 244 and the XOR gate 242 are connected with each other to define a divide-by-two frequency divider. Consequently, when the detecting signal DET is inactivated, the frequency divider 240 generates the detecting signal DET according to the first control signal Vco1. In addition, the frequency of the first control signal Vco1 is twice as large as the frequency of the detecting signal DET.

Moreover, the selecting circuit 250 comprises an AND gate 252 and a NOR gate 254. The two input terminals of the AND gate 252 receive the pumping enable signal ENP and the clock signal CLK, respectively. The first input terminal of the NOR gate 254 is connected to the output terminal of the AND gate 252. The second input terminal of the NOR gate 254 receives the detecting signal DET. The output terminal of the NOR gate 254 generates the oscillation signal Osc.

Figure 4:
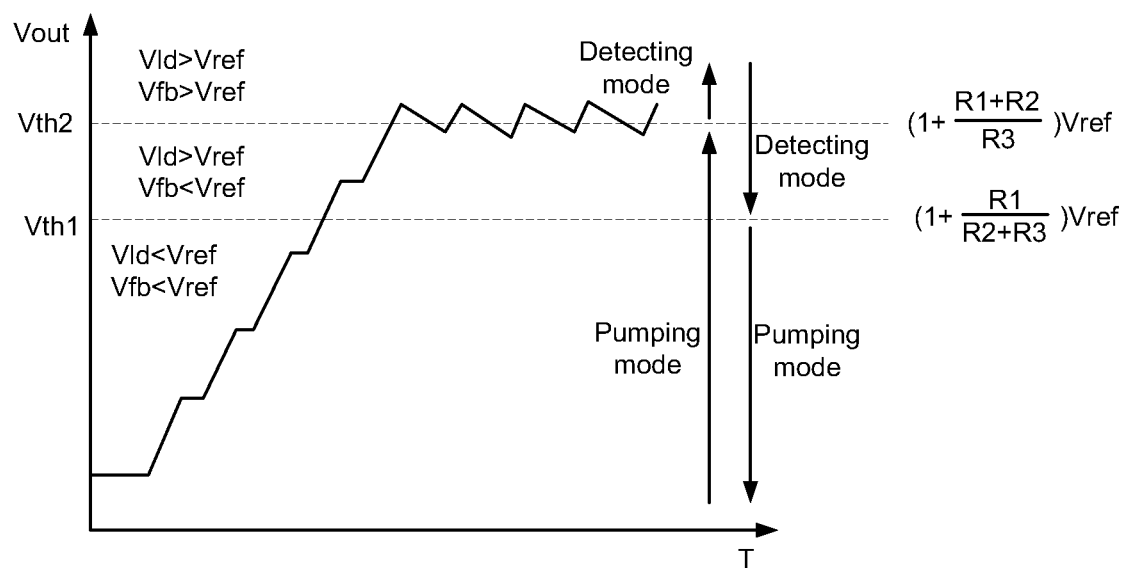
FIG. 4 is a plot illustrating a controlling method of the charge pump regulator in different operation modes according to the variations of the output signal Vout of the charge pump regulator.

FIG. 4 is a plot illustrating a controlling method of the charge pump regulator in different operation modes according to the variations of the output signal Vout of the charge pump regulator. The magnitude of the output signal Vout is divided into three voltage intervals according to two threshold voltages Vth1 and Vth2.

In the first voltage interval, the magnitude of the output signal Vout is lower than the first threshold voltage Vth1, and both of the first divided voltage Vfb and the second divided voltage Vld are lower than the reference voltage Vref. In the second voltage interval, the magnitude of the output signal Vout is in the range between the first threshold voltage Vth1 and the second threshold voltage Vth2, the first divided voltage Vfb is lower than the reference voltage Vref, and the second divided voltage Vld is higher than the reference voltage Vref. In the third voltage interval, the magnitude of the output signal Vout is higher than the second threshold voltage Vth2, and both of the first divided voltage Vfb and the second divided voltage Vld are higher than the reference voltage Vref. In this embodiment, the first threshold voltage Vth1 is expressed as Vth1=Vref×[1+R1/(R2+R3)], and the target voltage is equal to the second threshold voltage Vth2. The second threshold voltage Vth2 is expressed as Vth2=Vref×[1+(R1+R2)/R3].

Please refer to FIG. 4. While the magnitude of the output signal Vout gradually increases and the magnitude of the output signal Vout is lower than the second threshold voltage Vth2, the charge pump regulator 200 is in the pumping mode. While the magnitude of the output signal Vout gradually increases and the magnitude of the output signal Vout is higher than the second threshold voltage Vth2, the charge pump regulator 200 is in the detecting mode.

While the magnitude of the output signal Vout gradually decreases and the magnitude of the output signal Vout is higher than the first threshold voltage Vth1, the charge pump regulator 200 is in the detecting mode. While the magnitude of the output signal Vout gradually decreases and the magnitude of the output signal Vout is lower than the first threshold voltage Vth1, the charge pump regulator 200 is in the pumping mode.

If the charge pump regulator 200 is in the pumping mode, since the output signal Vout is lower than the target voltage (i.e. the second threshold voltage), it is not necessary to take the ripple of the output signal Vout into consideration. Under this circumstance, the clock signal CLK is converted into the oscillation signal Osc, and the oscillation signal Osc is inputted into the charge pump circuit 210.

If the charge pump regulator 200 is in the detecting mode, since the output signal Vout has reached the target voltage (i.e. the second threshold voltage), the ripple of the output signal Vout should be taken into consideration. Under this circumstance, the detecting signal DET is converted into the oscillation signal Osc, and the oscillation signal Osc is inputted into the charge pump circuit 210. Moreover, according to the relationship between the first divided voltage Vfb and the reference voltage Vref, the first control signal Vco1 is generated. By the frequency divider 240, the frequency of the first control signal Vco1 is a multiple of the frequency of the detecting signal DET. For example, the frequency of the first control signal Vco1 is twice as large as the frequency of the detecting signal DET.

Figure 5:
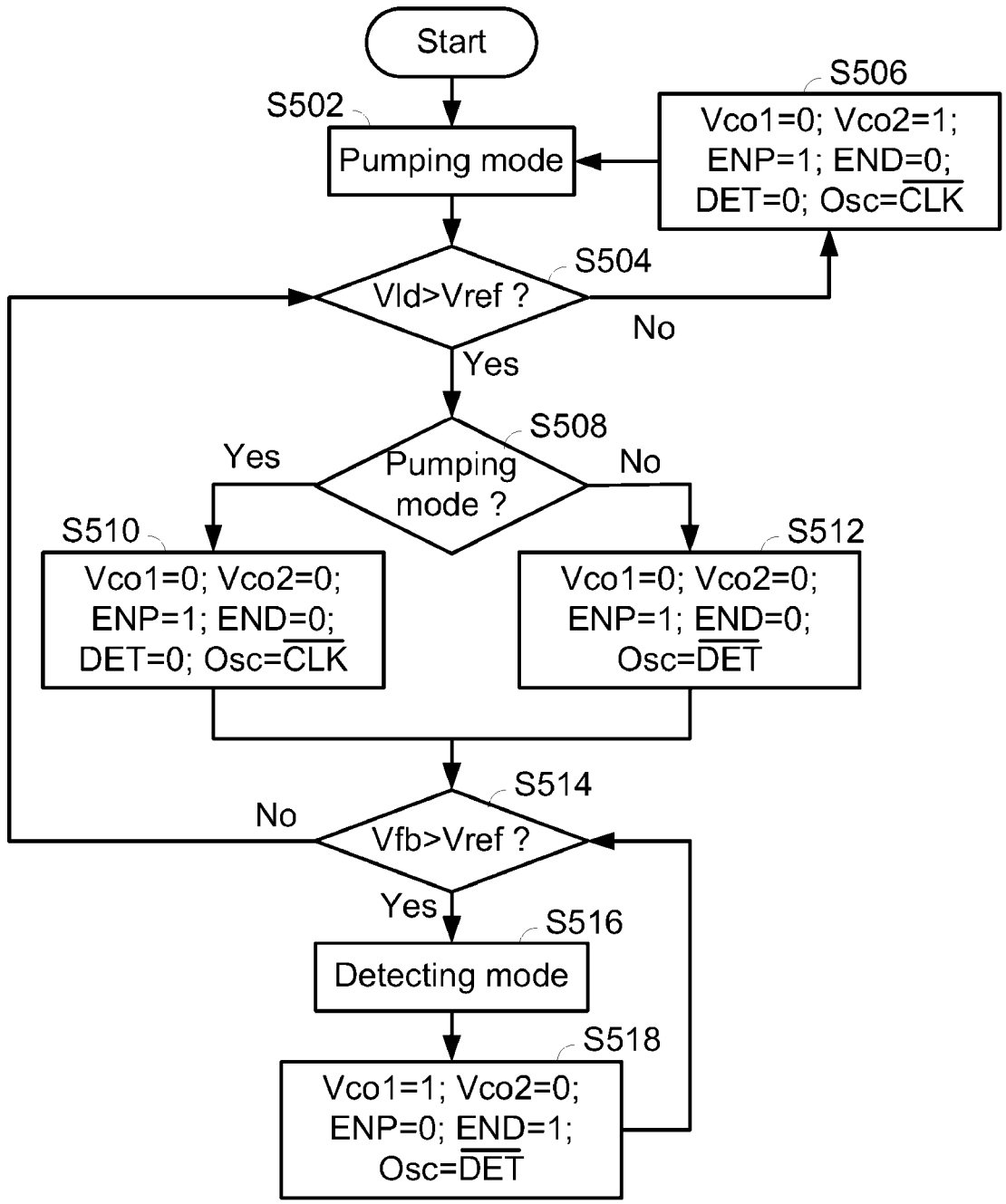
FIG. 5 is a flowchart illustrating the operations of the charge pump regulator according to the embodiment of the present invention.

FIG. 5 is a flowchart illustrating the operations of the charge pump regulator according to the embodiment of the present invention.

First of all, the charge pump regulator 200 is in the pumping mode (Step S502). Then, the step S504 is performed to judge whether the second divided voltage Vld is higher than the reference voltage Vref.

If the second divided voltage Vld is not higher than the reference voltage Vref, it means that the magnitude of the output signal Vout is lower than the first threshold voltage Vth1. Consequently, the step S506 is performed. Meanwhile, the first control signal Vco1 is "0", the second control signal Vco2 is "1", the pumping enable signal ENP is "1", the detecting enable signal END is "0", the detecting signal DET is "0", and the oscillation signal Osc is equal to the inverted clock signal $\overline{CLK}$ (i.e. Osc=$\overline{CLK}$).

If the second divided voltage Vld is higher than the reference voltage Vref, it means that the magnitude of the output signal Vout is higher than the first threshold voltage Vth1. Since the charge pump regulator 200 is in the pumping mode (Step S508), the step S510 is performed. Meanwhile, the first control signal Vco1 is "0", the second control signal Vco2 is "0", the pumping enable signal ENP is "1", the detecting enable signal END is "0", the detecting signal DET is "0", and the oscillation signal Osc is equal to the inverted clock signal $\overline{CLK}$ (i.e. Osc=$\overline{CLK}$).

After the step S510, the step S514 is performed to judge whether the first divided voltage Vfb is higher than the reference voltage Vref. If the first divided voltage Vfb is not higher than the reference voltage Vref, it means that the magnitude of the output signal Vout is lower than the second threshold voltage Vth2. Consequently, the step S504 is repeatedly done.

If the judging result of the step S514 indicates that the first divided voltage Vfb is higher than the reference voltage Vref, the magnitude of the output signal Vout is higher than the second threshold voltage Vth2. Then, the charge pump regulator 200 is in the detecting mode (Step S516). Then, the step S518 is performed. Meanwhile, the first control signal Vco1 is "1", the second control signal Vco2 is "0", the pumping enable signal ENP is "0", the detecting enable signal END is "1", and the oscillation signal Osc is equal to the inverted detecting signal $\overline{DET}$ (i.e. Osc=$\overline{DET}$).

After the step S518, the step S514 is repeatedly done to judge whether the first divided voltage Vfb is higher than the reference voltage Vref. If the judging result of the step S514 indicates that the first divided voltage Vfb is higher than the reference voltage Vref, the magnitude of the output signal Vout is higher than the second threshold voltage Vth2. Then, the charge pump regulator 200 is in the detecting mode (Step S516).

If the first divided voltage Vfb is not higher than the reference voltage Vref, the magnitude of the output signal Vout is lower than the second threshold voltage Vth2. Since the judging result of the step S508 indicates that the charge pump regulator 200 is in the detecting mode rather than in the pumping mode, the step S512 will be performed. Meanwhile, the first control signal Vco1 is "0", the second control signal Vco2 is "0", the pumping enable signal ENP is "0", the detecting enable signal END is "1", and the oscillation signal Osc is equal to the inverted detecting signal $\overline{DET}$ (i.e. Osc=$\overline{DET}$). Then, the step S514 is performed.

Figure 6:
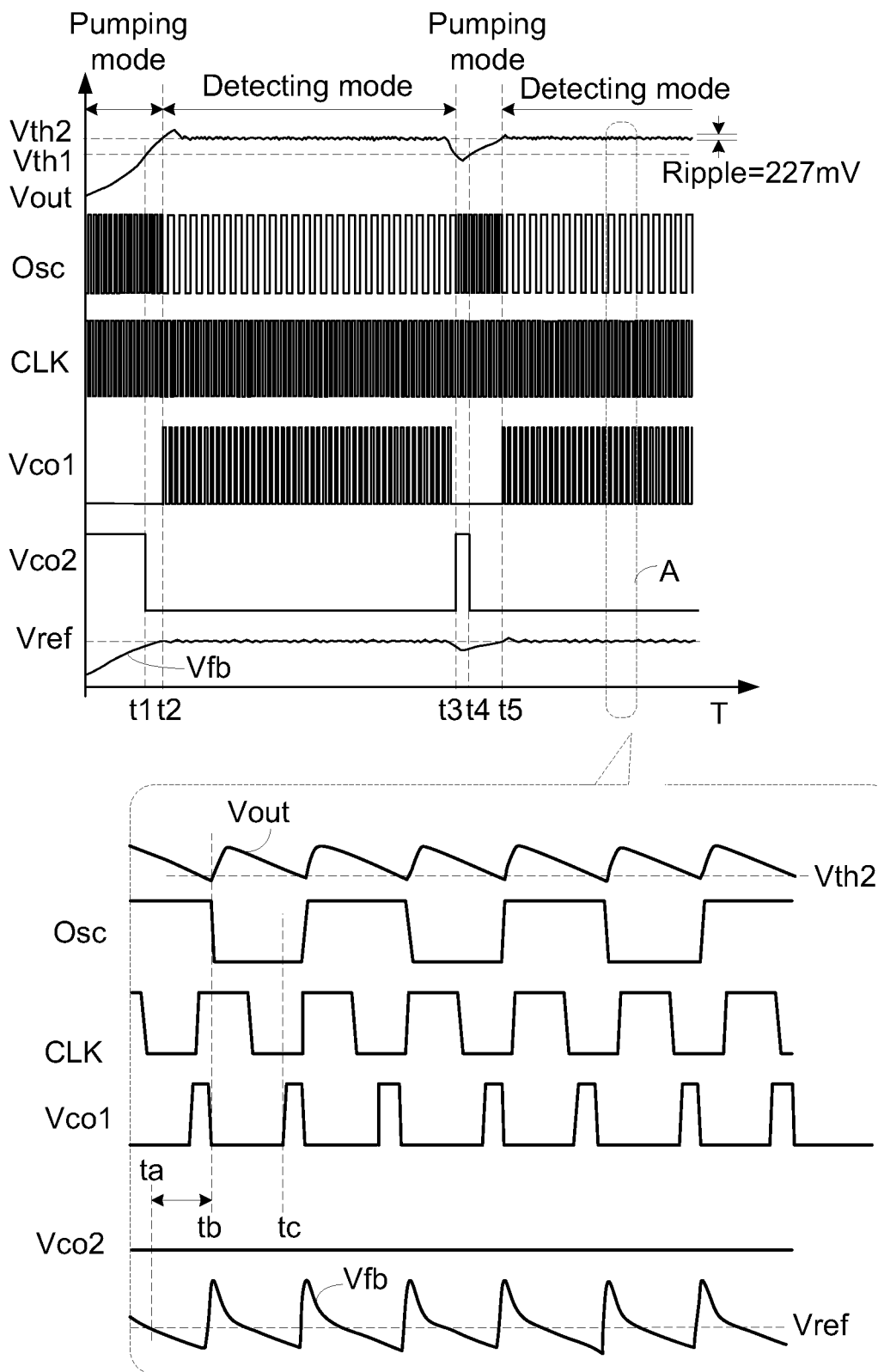
FIG. 6 is a schematic timing waveform diagram illustrating associated signal processed by the charge pump regulator according to the embodiment of the present invention.

FIG. 6 is a schematic timing waveform diagram illustrating associated signal processed by the charge pump regulator according to the embodiment of the present invention.

Before the time point t1, the magnitude of the output signal Vout is lower than the first threshold voltage Vth1. Meanwhile, the first control signal Vco1 is "0", the second control signal Vco2 is "1", and the charge pump regulator 200 is in the pumping mode.

During the time period between the time point t1 and the time point t2, the magnitude of the output signal Vout is in the range between the first threshold voltage Vth1 and the second threshold voltage Vth2. Meanwhile, the first control signal Vco1 is "0", the second control signal Vco2 is "0", and the charge pump regulator 200 is in the pumping mode.

At the time point t2, the magnitude of the output signal Vout is higher than the second threshold voltage Vth2. According to the relationship between the first divided voltage Vfb and the reference voltage Vref, the first control signal Vco1 is switched between "1" and "0". The second control signal Vco2 is "0". In addition, the charge pump regulator 200 is in the detecting mode.

During the time period between the time point t2 and the time point t3, the magnitude of the output signal Vout is higher than the first threshold voltage Vth1. Meanwhile, the charge pump regulator 200 is in the detecting mode.

During the time period between the time point t3 and the time point t4, the magnitude of the output signal Vout is lower than the first threshold voltage Vth1. Meanwhile, the first control signal Vco1 is "0", the second control signal Vco2 is "1", and the charge pump regulator 200 is in the pumping mode.

During the time period between the time point t4 and the time point t5, the magnitude of the output signal Vout is in the range between the first threshold voltage Vth1 and the second threshold voltage Vth2. Meanwhile, the first control signal Vco1 is "0", the second control signal Vco2 is "0", and the charge pump regulator 200 is in the pumping mode.

After the time point t5, the magnitude of the output signal Vout is higher than the second threshold voltage Vth2. According to the relationship between the first divided voltage Vfb and the reference voltage Vref, the first control signal Vco1 is switched between "1" and "0". The second control signal Vco2 is "0". In addition, the charge pump regulator 200 is in the detecting mode.

Please refer to an enlarged fragmentary portion A of FIG. 6. At the time point ta, the magnitude of the first divided voltage Vfb is lower than the reference voltage Vref. Due to the output delay of the comparator 234, the first control signal Vco1 from the comparator 234 is switched to the low level state until the time point tb.

At the time point tb, the first control signal Vco1 is switched from the high level state to the low level state. In addition, the oscillation signal Osc results in a signal edge (e.g. a falling edge). In other words, the detector 260 of the charge pump regulator 200 does not result in the enable pump delay period. Consequently, the problem of causing the excess decrease of the output signal Vout is eliminated.

At the time point tc, the first control signal Vco1 is switched from the low level state to the high level state. Meanwhile, the oscillation signal Osc does not result in a signal edge. In other words, the detector 260 of the charge pump regulator 200 does not result in the disable pump delay period. Consequently, the problem of causing the excess increase of the output signal Vout is eliminated.

The performance of the charge pump regulator 200 will be illustrated as follows. For example, if (R1+R2)/R3 is equal to 4, the reference voltage Vref is 1.2V and the magnitude of the output signal Vout is 6V, the peak-to-peak ripple voltage of the output signal Vout is about 227 mV. Obviously, the charge pump regulator 200 is effective to reduce the ripple of the output signal Vout.

Figure 7:
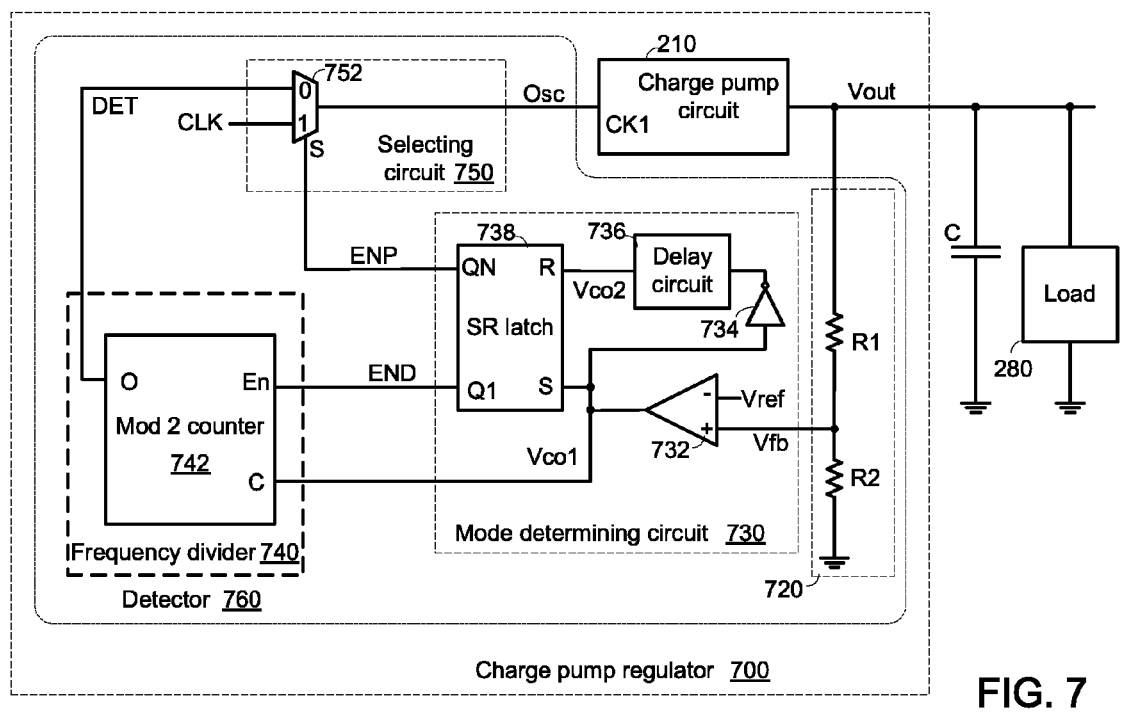
FIG. 7 is a schematic circuit block diagram illustrating a charge pump regulator according to another embodiment of the present invention.

It is noted that numerous modifications of the detector of the charge pump regulator may be made while retaining the teachings of the invention. FIG. 7 is a schematic circuit block diagram illustrating a charge pump regulator according to another embodiment of the present invention. As shown in FIG. 7, the charge pump regulator 700 comprises a charge pump circuit 210 and a detector 760. Except for the detector 760, the other components of the charge pump regulator 700 are similar to those of FIG. 3.

The detector 760 comprises a voltage divider 720, a mode determining circuit 730, a frequency divider 740, and a selecting circuit 750.

The voltage divider 720 consists of plural resistors R1 and R2, which are arranged between the output terminal of the charge pump circuit 210 and a ground terminal in series. The node voltage at the node between the first resistor R1 and the second resistor R2 is equal to a first divided voltage Vfb. The first divided voltage Vfb may be expressed as Vfb=Vref× (R2)/(R1+R2). Moreover, when the charge pump regulator 700 reaches the steady state, the output signal Vout is maintained at a level near a target voltage. The target voltage is equal to Vref×[1+(R1+R2)/R3].

The mode determining circuit 730 comprises a comparator 732, a NOT gate 734, a delay circuit 736 and a SR latch 738. The positive input terminal of the comparator 732 receives the first divided voltage Vfb. The negative input terminal of the comparator 732 receives a reference voltage Vref. The output terminal of the comparator 732 issues a first control signal Vco1. The input terminal of the NOT gate 734 receives the first control signal Vco1. The output terminal of the NOT gate 734 is connected to the delay circuit 736 and generates an inverted first control signal $\overline{Vco1}$. After the inverted first control signal $\overline{Vco1}$ is delayed for about 20 ns by the delay circuit 736, the second control signal Vco2 is generated. A set terminal S of the SR latch 738 receives the first control signal Vco1. A reset terminal R of the SR latch 738 receives the second control signal Vco2. An output terminal Q1 of the SR latch 738 generates the detecting enable signal END. An inverted output terminal QN of the SR latch 738 generates the pumping enable signal ENP.

In this embodiment, the frequency divider 740 comprises a mod 2 counter 742. The enable terminal En of the mod 2 counter 742 receives the detecting enable signal END. The count terminal C of the mod 2 counter 742 receives the first control signal Vco1. Consequently, the output terminal O of the mod 2 counter 742 generates a detecting signal DET. In this embodiment, the frequency of the first control signal Vco1 is twice as large as the frequency of the detecting signal DET.

The selecting circuit 750 comprises a multiplexer 752. The two input terminals of the multiplexer 752 receive the clock signal CLK and the detecting signal DET, respectively. The select terminal S of the multiplexer 752 receives the pumping enable signal ENP. When the pumping enable signal ENP is activated, the clock signal CLK is converted into the oscillation signal Osc by the selecting circuit 750. On the other hand, when the pumping enable signal ENP is inactivated, the detecting signal DET is converted into the oscillation signal Osc by the selecting circuit 750.

Moreover, the selecting circuit 250 and the frequency divider 240 used in the charge pump regulator 200 of FIG. 3 may be used in the charge pump regulator 700 of this embodiment. Similarly, the selecting circuit 750 and the frequency divider 740 used in the charge pump regulator 700 of this embodiment may be used in the charge pump regulator 200 of FIG. 3. Obviously, the variants of the charge pump regulator are effective to reduce the ripple of the output signal Vout.

From the above descriptions, the present invention provides a charge pump regulator with a small ripple output signal for avoiding the excess increase and the excess decrease of the output signal in the enable pump delay period and the disable pump delay period. Consequently, the peak-to-peak ripple voltage of the output signal is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A charge pump regulator, comprising:
a charge pump circuit having a clock input terminal receiving an oscillation signal and an output terminal generating an output signal;
a voltage divider receiving the output signal and generating a first divided voltage and a second divided voltage;
a mode determining circuit receiving the first divided voltage and the second divided voltage, and determining whether the charge pump regulator is in a pumping mode or a detecting mode according to the first divided voltage and the second divided voltage, wherein the mode determining circuit issues a first control signal, wherein a pumping enable signal is activated when the mode determining circuit is in the pumping mode, and a detecting enable signal is activated when the mode determining circuit is in the detecting mode;
a frequency divider receiving the detecting enable signal and the first control signal, wherein when the detecting enable signal is activated, the frequency divider generates a detecting signal according to the first control signal, wherein a frequency of the first control signal is a multiple of a frequency of the detecting signal; and
a selecting circuit receiving the detecting signal, a clock signal and the pumping enable signal, wherein when the pumping enable signal is activated, the clock signal is converted into the oscillation signal by the selecting circuit, wherein when the pumping enable signal is inactivated, the detecting signal is converted into the oscillation signal by the selecting circuit.

2. The charge pump regulator as claimed in claim 1, wherein when the oscillation signal is maintained at a fixed voltage level, a magnitude of the output signal gradually decreases, wherein when the oscillation signal is switched between a high level state and a low level state, the magnitude of the output signal gradually increases according to a signal edge of the oscillation signal.

3. The charge pump regulator as claimed in claim 1, wherein there are fixed ratios between the output signal, the first divided voltage and the second divided voltage in the voltage divider, wherein the output signal is higher than the second divided voltage, and the second divided voltage is higher than the first divided voltage.

4. The charge pump regulator as claimed in claim 3, wherein the voltage divider comprises a first resistor, a second resistor and a third resistor, which are arranged between the output terminal of the charge pump circuit and a ground terminal in series, wherein a first node between the first resistor and the second resistor generates the second divided voltage, and a second node between the second resistor and the third resistor generates the first divided voltage.

5. The charge pump regulator as claimed in claim 1, wherein the mode determining circuit comprises:
a first comparator, wherein a positive input terminal of the first comparator receives a reference voltage, a negative input terminal of the first comparator receives the second divided voltage, and an output terminal of the first comparator generates a second control signal;
a second comparator, wherein a positive input terminal of the second comparator receives the first divided voltage, a negative input terminal of the second comparator receives the reference voltage, and an output terminal of the second comparator generates the first control signal; and
an SR latch, wherein a set terminal of the SR latch receives the first control signal, a reset terminal of the SR latch receives the second control signal, an output terminal of the SR latch generates the detecting enable signal, and an inverted output terminal of the SR latch generates the pumping enable signal.

6. The charge pump regulator as claimed in claim 1, wherein the frequency divider comprises:
an XOR gate, wherein a first input terminal of the XOR gate receives the detecting enable signal, and a second input terminal of the XOR gate receives the detecting signal; and
a D flip-flop, wherein an input terminal of the D flip-flop is connected to an output terminal of the XOR gate, a rest terminal of the D flip-flop receives the detecting enable signal, a clock input terminal of the D flip-flop receives the first control signal, and an output terminal of the D flip-flop generates the detecting signal, wherein the D flip-flop is a negative edge triggered D flip-flop, wherein when the detecting enable signal is inactivated, the D flip-flop is reset.

7. The charge pump regulator as claimed in claim 1, wherein the frequency divider comprises a mod 2 counter, wherein an enable terminal of the mod 2 counter receives the detecting enable signal, a count terminal of the mod 2 counter receives the first control signal, and an output terminal of the mod 2 counter generates the detecting signal.

8. The charge pump regulator as claimed in claim 1, wherein the selecting circuit comprises:
an AND gate, wherein a first input terminal of the AND gate receives the pumping enable signal, and a second input terminal of the AND gate receives the clock signal; and
a NOR gate, wherein a first input terminal of the NOR gate is connected to an output terminal of the AND gate, a second input terminal of the NOR gate receives the detecting signal, and an output terminal of the NOR gate generates the oscillation signal.

9. The charge pump regulator as claimed in claim 1, wherein the selecting circuit comprises a multiplexer, wherein a first input terminal of the multiplexer receives the clock signal, a second input terminal of the multiplexer receives the detecting signal, a select terminal of the multiplexer receives the pumping enable signal, and an output terminal of the multiplexer generates the oscillation signal.

10. A charge pump regulator, comprising:
a charge pump circuit having a clock input terminal receiving an oscillation signal and an output terminal generating an output signal;
a voltage divider receiving the output signal and generating a first divided voltage;
a mode determining circuit receiving the first divided voltage, and determining whether the charge pump regulator is in a pumping mode or a detecting mode according to the first divided voltage, wherein the mode determining circuit issues a first control signal, wherein a pumping enable signal is activated when the mode determining circuit is in the pumping mode, and a detecting enable signal is activated when the mode determining circuit is in the detecting mode;
a frequency divider receiving the detecting enable signal and the first control signal, wherein when the detecting enable signal is activated, the frequency divider generates a detecting signal according to the first control signal, wherein a frequency of the first control signal is a multiple of a frequency of the detecting signal; and a selecting circuit receiving the detecting signal, a clock signal and the pumping enable signal, wherein when the pumping enable signal is activated, the clock signal is converted into the oscillation signal by the selecting circuit, wherein when the pumping enable signal is inactivated, the detecting signal is converted into the oscillation signal by the selecting circuit.

11. The charge pump regulator as claimed in claim 10, wherein when the oscillation signal is maintained at a fixed voltage level, a magnitude of the output signal gradually decreases, wherein when the oscillation signal is switched between a high level state and a low level state, the magnitude of the output signal gradually increases according to a signal edge of the oscillation signal.

12. The charge pump regulator as claimed in claim 10, wherein there is a fixed ratio between the output signal and the first divided voltage in the voltage divider, wherein the output signal is higher than the first divided voltage.

13. The charge pump regulator as claimed in claim 12, wherein the voltage divider comprises a first resistor and a second resistor, which are arranged between the output terminal of the charge pump circuit and a ground terminal in series, wherein a first node between the first resistor and the second resistor generates the first divided voltage.

14. The charge pump regulator as claimed in claim 10, wherein the mode determining circuit comprises:
 a comparator, wherein a positive input terminal of the comparator receives the first divided voltage, a negative input terminal of the comparator receives a reference voltage, and an output terminal of the first comparator generates the first control signal;
 a NOT gate, wherein an input terminal of the NOT gate receives the first control signal, and an output terminal of the NOT gate generates an inverted first control signal;
 a delay circuit, wherein after the inverted first control signal is delayed for a delaying time by the delay circuit, a second control signal is generated; and
 an SR latch, wherein a set terminal of the SR latch receives the first control signal, a reset terminal of the SR latch receives the second control signal, an output terminal of the SR latch generates the detecting enable signal, and an inverted output terminal of the SR latch generates the pumping enable signal.

15. The charge pump regulator as claimed in claim 10, wherein the frequency divider comprises:
 an XOR gate, wherein a first input terminal of the XOR gate receives the detecting enable signal, and a second input terminal of the XOR gate receives the detecting signal; and
 a D flip-flop, wherein an input terminal of the D flip-flop is connected to an output terminal of the XOR gate, a rest terminal of the D flip-flop receives the detecting enable signal, a clock input terminal of the D flip-flop receives the first control signal, and an output terminal of the D flip-flop generates the detecting signal, wherein the D flip-flop is a negative edge triggered D flip-flop, wherein when the detecting enable signal is inactivated, the D flip-flop is reset.

16. The charge pump regulator as claimed in claim 10, wherein the frequency divider comprises a mod 2 counter, wherein an enable terminal of the mod 2 counter receives the detecting enable signal, a count terminal of the mod 2 counter receives the first control signal, and an output terminal of the mod 2 counter generates the detecting signal.

17. The charge pump regulator as claimed in claim 10, wherein the selecting circuit comprises:
 an AND gate, wherein a first input terminal of the AND gate receives the pumping enable signal, and a second input terminal of the AND gate receives the clock signal; and
 a NOR gate, wherein a first input terminal of the NOR gate is connected to an output terminal of the AND gate, a second input terminal of the NOR gate receives the detecting signal, and an output terminal of the NOR gate generates the oscillation signal.

18. The charge pump regulator as claimed in claim 10, wherein the selecting circuit comprises a multiplexer, wherein a first input terminal of the multiplexer receives the clock signal, a second input terminal of the multiplexer receives the detecting signal, a select terminal of the multiplexer receives the pumping enable signal, and an output terminal of the multiplexer generates the oscillation signal.

19. A method for controlling a charge pump regulator in a pumping mode or in a detecting mode in response to a comparison among an output voltage of the charge pump regulator, a first threshold voltage and a second threshold voltage, the method comprising steps of:
 operating the charge pump regulator in the pumping mode when a magnitude of the output voltage of the charge pump regulator increases and the magnitude of the output voltage of the charge pump regulator is lower than the second threshold voltage, wherein a charge pump circuit of the charge pump regulator is activated to increase the magnitude of the output voltage of the charge pump regulator in the pumping mode;
 operating the charge pump regulator in the detecting mode when the magnitude of an output voltage of the charge pump regulator increases and the magnitude of the output voltage of the charge pump regulator is higher than the second threshold voltage, wherein a charge pump circuit of the charge pump regulator is activated to maintain the magnitude of the output voltage of the charge pump regulator near a target voltage in the detecting mode;
 operating the charge pump regulator in the detecting mode when the magnitude of an output voltage of the charge pump regulator decreases and the magnitude of the output voltage of the charge pump regulator is higher than the first threshold voltage; and
 operating the charge pump regulator in the pumping mode when the magnitude of an output voltage of the charge pump regulator decreases and the magnitude of the output voltage of the charge pump regulator is lower than the first threshold voltage;
 wherein the second threshold voltage is higher than the first threshold voltage.

20. The method as claimed in claim 19, wherein a clock signal is converted to an oscillation signal to activate the charge pump circuit in the pumping mode; and a detecting signal is converted to the oscillation signal to activate the charge pump circuit in the detecting mode.

21. The method as claimed in claim 20, wherein a voltage divider of the charge pump regulator receives the output voltage and generates a divided voltage; and the detecting signal is generated in response to a comparison result between the divided voltage and a reference voltage.

* * * * *